(12) United States Patent
Zhang et al.

(10) Patent No.: US 11,217,630 B2
(45) Date of Patent: Jan. 4, 2022

(54) IMPLEMENTING MEMRISTOR CROSSBAR ARRAY USING NON-FILAMENTARY RRAM CELLS

(71) Applicant: TETRAMEM INC., Newark, CA (US)

(72) Inventors: Minxian Zhang, Newark, CA (US); Ning Ge, Newark, CA (US)

(73) Assignee: TetraMem Inc., Newark, CA (US)

( * ) Notice: Subject to any disclaimer, the term of this patent is extended or adjusted under 35 U.S.C. 154(b) by 0 days.

(21) Appl. No.: 16/393,883

(22) Filed: Apr. 24, 2019

(65) Prior Publication Data

US 2020/0343305 A1   Oct. 29, 2020

(51) Int. Cl.
*H01L 45/00* (2006.01)
*H01L 27/24* (2006.01)

(52) U.S. Cl.
CPC ...... *H01L 27/2463* (2013.01); *H01L 27/2436* (2013.01); *H01L 45/08* (2013.01); *H01L 45/145* (2013.01); *H01L 45/146* (2013.01)

(58) Field of Classification Search
CPC ..................................................... H01L 45/08
See application file for complete search history.

(56) References Cited

U.S. PATENT DOCUMENTS

| | | | |
|---|---|---|---|
| 9,613,689 B1* | 4/2017 | Takaki | G11C 13/0026 |
| 2017/0309324 A1* | 10/2017 | Kumar | G11C 13/003 |
| 2018/0212147 A1* | 7/2018 | Ruiz | H01L 45/14 |

* cited by examiner

*Primary Examiner* — Peniel M Gumedzoe
*Assistant Examiner* — Christopher A Johnson
(74) *Attorney, Agent, or Firm* — MagStone law LLP

(57) ABSTRACT

Technologies relating to implementing memristor crossbar arrays using non-filamentary RRAM cells are disclosed. In some implementations, an apparatus comprises: a first row wire; a first column wire; a non-filamentary RRAM; and an access control device. The non-filamentary RRAM and the access control device are serially connected; the non-filamentary RRAM and the access control device connect the first row wire with the first column wire. The non-filamentary RRAM and the access control device may form a cross-point device. The cross-point device may be less than 40×40 nm². A set current of the non-filamentary RRAM may be no more than 10 µA; and a reset current of the non-filamentary RRAM is no more than 10 µA. The access control device may comprise a transistor or a selector.

6 Claims, 5 Drawing Sheets

| Issues | Filamentary RRAM | Non-Filamentary RRAM |
|---|---|---|
| Area Scaling | No | Yes |
| Gradual Set | Yes | Yes |
| Gradual Reset | No | Yes |
| Low Operation Current | No | Yes |
| Low Transistor Current | No | Yes |
| Low Set/Reset Voltage | Yes | No |

IMPLEMENTING MEMRISTOR CROSSBAR ARRAY USING NON-FILAMENTARY RRAM CELLS

TECHNICAL FIELD

The present disclosure generally related to crossbar array circuits with Resistive Random-Access Memory (RRAM) and more specifically to implementing memristor crossbar arrays using non-filamentary RRAM cells.

BACKGROUND

Traditionally, a crossbar array circuit may include horizontal metal wire rows and vertical metal wire columns (or other electrodes) intersecting with each other, with crossbar devices formed at the intersecting points. A crossbar array may be used in non-volatile solid-state memory, signal processing, control systems, high-speed image processing systems, neural network systems, and so on.

A RRAM is a two-terminal passive device capable of changing resistance responsive to sufficient electrical stimulations, which have attracted significant attention for high-performance non-volatile memory applications. The resistance of a RRAM may be electrically switched between two states: a High-Resistance State (HRS) and a Low-Resistance State (LRS). The switching event from a FIRS to a LRS is often referred to as a "Set" or "On" switch; the switching systems from a LRS to a FIRS is often referred to as a "Reset" or "Off" switching process.

Filamentary RRAMs, however, do not have the bi-directional analog resistance characteristics. There are issues when scaling down for the filamentary RRAM. Also, a filamentary RRAM does not function well in a low read current operation, because it requires high read current and high reset current.

SUMMARY

Technologies relating to implementing memristor crossbar arrays using non-filamentary RRAM cells are disclosed.

Apparatus of memristor crossbar array using non-filamentary RRAM cells for low current analog memory-based accelerator computing are disclosed. In some implementations, an apparatus comprises: a first row wire; a first column wire; a non-filamentary RRAM; an access control device, wherein the non-filamentary RRAM and the access control device serially connected and connecting between the first row wire and the first column wire.

In some implementations, the non-filamentary RRAM and the access control device form a cross-point device, and the cross-point device is less than 40×40 $nm^2$.

In some implementations, a set and/or reset current of the non-filamentary RRAM is no more than 10 µA.

In some implementations, the access control device comprises a transistor or a selector.

In some implementations, the non-filamentary RRAM comprises a vacancy modulated conductive oxide (VMCO, $TiN/TiO_2/a$-$Si/TiN$), $TiN/Ta_2O_5/TaO_x/TiN$ RRAM, $Ta/TaO_x/TiO_2/Ti$ RRAM, and $TiN/TiO_2/Al_2O_3/TiN$ RRAM.

BRIEF DESCRIPTION OF THE DRAWINGS

FIG. 3 is a table comparing example properties of a filamentary RRAM with those of a non-filamentary RRAM in accordance with some implementations of the present disclosure.

The implementations disclosed herein are illustrated by way of example, and not by way of limitation, in the figures of the accompanying drawings. Like reference numerals refer to corresponding parts throughout the drawings.

DETAILED DESCRIPTION

Technologies relating to implementing memristor crossbar arrays using non-filamentary RRAM cells are disclosed. The technologies described in the present disclosure may provide the following technical advantages.

FIG. 1A is a cross-sectional view 100 of an example filamentary RRAM device in a low resistance state in accordance with some implementations of the present disclosure. FIG. 1B is a cross-sectional view 150 of the example filamentary RRAM device in a high resistance state in accordance with some implementations of the present disclosure.

Figure 1:
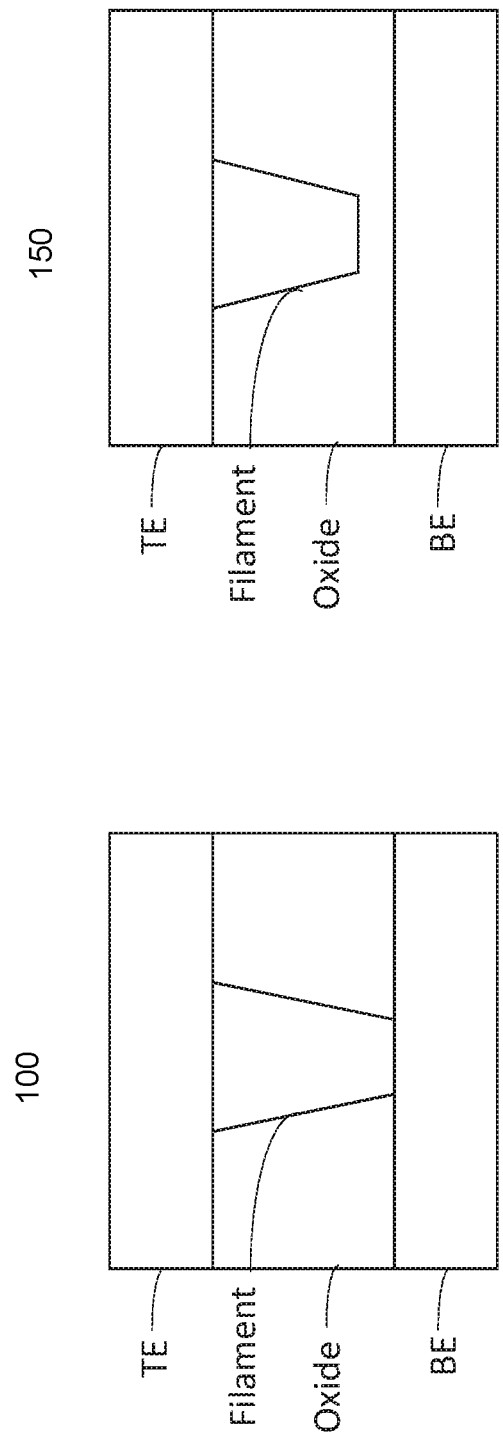
FIGS. 1A and 1B are cross-sectional views of an example filamentary RRAM device in different resistance states in accordance with some implementations of the present disclosure.

As shown in FIG. 1, the filamentary RRAM device includes a bottom electrode (BE), a switching oxide (Oxide), a top electrode (TE), and a conductive filament (Filament, which may be metal rich or oxygen vacancy rich) grows from the top electrode toward the bottom electrode within the switching oxide. When the conductive filament is directly connected to the bottom electrode, the RRAM is set to ON or in LRS, as shown in FIG. 1A. When the conductive filament ruptures and becomes separated from the bottom electrode, the filamentary RRAM device is reset to OFF or HRS, as shown in FIG. 1B.

A filamentary RRAM device may have the following characteristics. First, the resistance of a filamentary RRAM device is not scaled with the size of the device. Once a filament is formed, the device resistance's is dominated by the filament, not by the size of the device. Second, a gradual set (for analog resistance) may be achieved in a LRS, as the filament resistance may be changed by the size of the filament. A gradual reset cannot be achieved, however, because, during a reset, the filament ruptures from the bottom electrode. Third, since analog resistance occurs in a LRS, the operation current in LRS is high, as is the programming current from transistor (in 1T1R). Fourth, joule heating generated by a filament may increase oxygen ions' mobility, thereby increasing switching speed and the deceasing the set and reset voltages.

Figure 2:
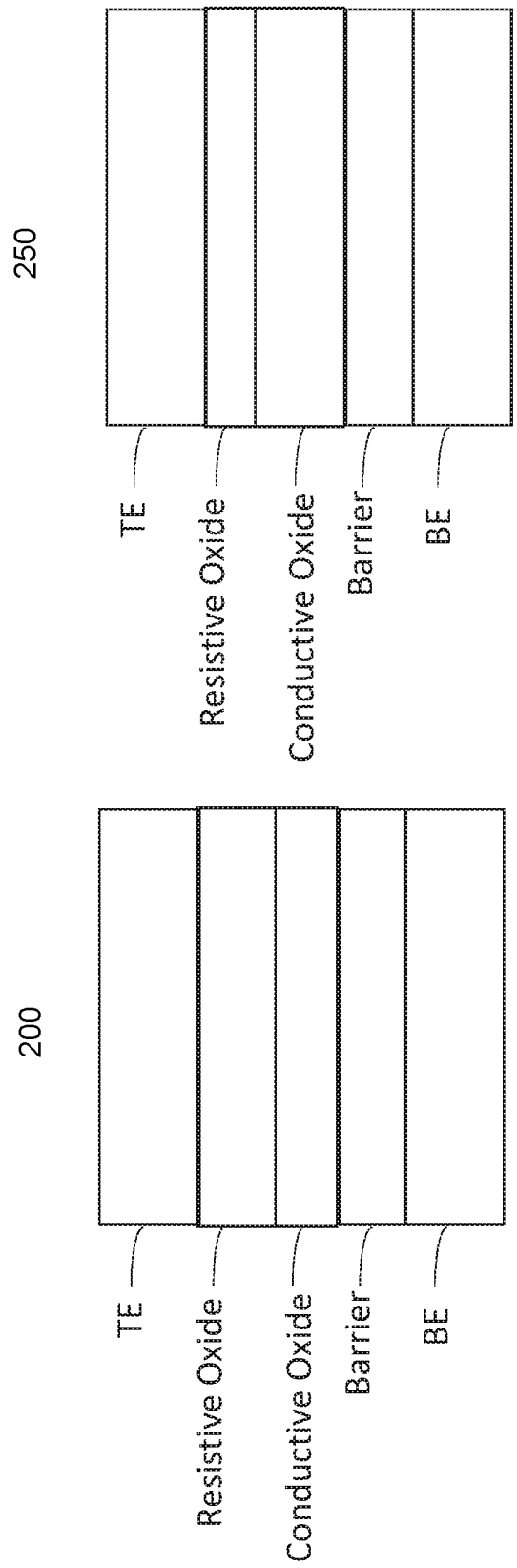
FIGS. 2A and 2B are cross-sectional views of an example non-filamentary RRAM device in different resistance states in accordance with some implementations of the present disclosure.

FIG. 2A is a cross-sectional view 200 of an example non-filamentary RRAM device in a high resistance state in accordance with some implementations of the present disclosure. FIG. 2B is a cross-sectional view 250 of the example of filamentary RRAM device in a low resistance state in accordance with some implementations of the present disclosure.

A non-filamentary RRAM device may include: a bottom electrode (BE), a barrier layer (Barrier), a switching oxide which may include a resistive oxide and a conductive oxide, and a top electrode (TE). The resistive oxide and conductive oxide may be made with the same metal oxide with different metal/oxygen stoichiometry. For instance, if the switching oxide is made of TiOx, the resistive oxide may be made of $TiO_2$, and the conductive oxide may be made of $TiO_{1.75}$, also called $Ti_4O_7$. When oxygen migrates from the conductive oxide to the resistive oxide, the resistive oxide layer becomes thicker and, as a result, the cell's resistance increases. The non-filamentary RRAM device switches into a HRS, as shown in FIG. 2A. When the oxygen migrates from the resistive oxide to the conductive oxide, the resistive oxide layer becomes thinner and, as a result, the cell's resistance decreases. The non-filamentary RRAM device switches into a LRS, as shown in FIG. 2B.

A non-filamentary RRAM device may have the following characteristics. First, the resistance of a non-filamentary RRAM device is scaled with the size of the device. A non-filamentary RRAM device's resistance is determined by the thickness and the cross-section area of the resistive oxide. Reducing the size of a non-filamentary RRAM device will increase the device's resistance. Second, both graduate set and gradual reset (for analog resistance) can be achieved. A non-filamentary RRAM device's resistance may be gradually increased (as oxygen moves into the resistive oxide) or gradually decreased (as oxygen moves away from the resistive oxide). This is useful for when bidirectional analog resistance is desired. Third, due to the lack of a filament, a non-filamentary RRAM device's operating current may be kept low, and the programming current from transistor (in 1T1R) may also be kept low. Fourth, due to the lack of joule heat generated by a filament, the oxygen ions' mobility is often low, thereby decreasing switching speed and the increasing the set and reset voltages.

An example comparison of characteristics of a non-filamentary RRAM device with those of a filamentary RRAM device is provided below.

(1) Bi-Directional Analog Resistance (from Set and Reset) v. One Directional Analog Resistance (from Set Only)

Filamentary RRAM cells may be used as memristors in cross-point devices to implement a crossbar array. Filamentary RRAMs, however, do not provide bi-directional analog resistance. During a set operation, oxygen ion migrates gradually (for example, in a vacancy mode) under electric fields, providing analogy resistance change in a low resistance state. During a reset operation, however, the rapture of the filament is abrupt, and no analog resistance can be achieved due to cells' resistance is dominated the oxide gap that analog resistance from oxide gap is very difficult in a high resistance state. Unlike a filamentary RRAM cell, a non-filamentary RRAM in a crossbar array may both gradually set and reset during a low current operation.

(2) Area Scaling

In a filamentary RRAM-based crossbar array, once a filament is formed, the cell's resistance is dominated by the filament's resistance, not by the device size. Therefore when the device size is scale down, the device's resistance is no scaled with device size in filamentary mode. In contrast, in a non-filamentary RRAM within a crossbar array, the cell's resistance may be scaled with device size.

(3) Low Read Current Operation & Low Reset Current

A filamentary RRAM requires high read currents and high reset currents and thus does not function well in a low read current operation. A filamentary RRAM has a relatively low cell resistance (for instance in LRS the resistance range is about 1 kΩ to 10 kΩ) comparing to a non-filamentary RRAM which has a higher cell resistance (LRS above 10 kΩ to 100 kΩ). Also, the conductance quantum ($7.75 \times 10^{-5}$ Siemens) of a filamentary RRAM limits the highest resistance in the filamentary mode to less than 12.9 kΩ. The low cell's resistance not only increases the operation current, but also require a higher reset current from the transistor and the circuit, which may cause some RRAM cells to fail to reset when the maximum current from transistor is not enough to reset the cell. A non-filamentary RRAM can have low operating current and do not have these technical challenges.

(4) Gradual Set and Reset

During a set operation with increasing voltage pulse under Incremental Step Pulse Programming (ISPP), both a filamentary RRAM and a non-filamentary RRAM cell may observe their gradual change in cell resistance. A filamentary RRAM, however, may not gradually reset, as filament rapture is abrupt, and it also requires a high current to reset. On the other hand, a non-filamentary RRAM cell is capable of gradual reset, which means, the non-filamentary RRAM cell's resistance can be gradually increased. Bidirectional analog behavior from non-filamentary RRAM is technically advantageous, when implementing RRAM cells in a crossbar array for hardware-based deep learning or neural network applications.

FIG. 3 is a table 300 comparing example properties of a filamentary RRAM device with those of a non-filamentary RRAM in accordance with some implementations of the present disclosure.

As shown in FIG. 3, using a non-filamentary RRAM device to implement a crossbar array has technically advantageous because it provides the following technical features: area scaling, gradual set and reset, and low operation current. Also, although high set and reset voltages may be required when using a non-filamentary RRAM to implement a crossbar array, the requirement for high pulse voltage may be reduced by increasing pulse width (or reducing switching speed).

To lower the requirement for high switching voltage without sacrificing switching speed, a non-filamentary RRAM-based crossbar array may be first used for a low current memory-based accelerator computing. The crossbar array's cell resistance may be programmed once and may then be read a plurality of times to take advantages of low operation current as accelerator computing. This may be referred to as the one write many read application.

Another technical advantage offered by a non-filamentary RRAM-based crossbar array in a low current memory-based accelerator computing is the flexibility to change its resistance in steps in both directions. For example, because the analog mode of a filamentary RRAM is in a low resistance state, although cell resistance may be decreased in steps, the cell resistance may not be increased in steps without a reset operation.

To increase the resistance in LRS, an RRAM cell needs to be reset to HRS first (to break the filament) and then return to LRS to produce the desirable LRS resistance with an appropriate set voltage. For example, for an LRS cell with 5 kΩ resistance, its resistance may be decreased to 4 kΩ with an increased voltage pulse. To increase its resistance from 5 kΩ to 6 kΩ, the cell needs to be reset to HRS first and then set to 6 kΩ LRS with an appropriate reset and set voltage.

In non-filamentary RRAM-based crossbar arrays, it is feasible to change cell resistance in steps in either direction, without resetting a non-filamentary RRAM. At a particular cell resistance level, its resistance may be decreased (set) or increased (reset) further with appropriate voltages (as defined by appropriate voltage polarity, pulse amplitude, and pulse width).

Figure 4:
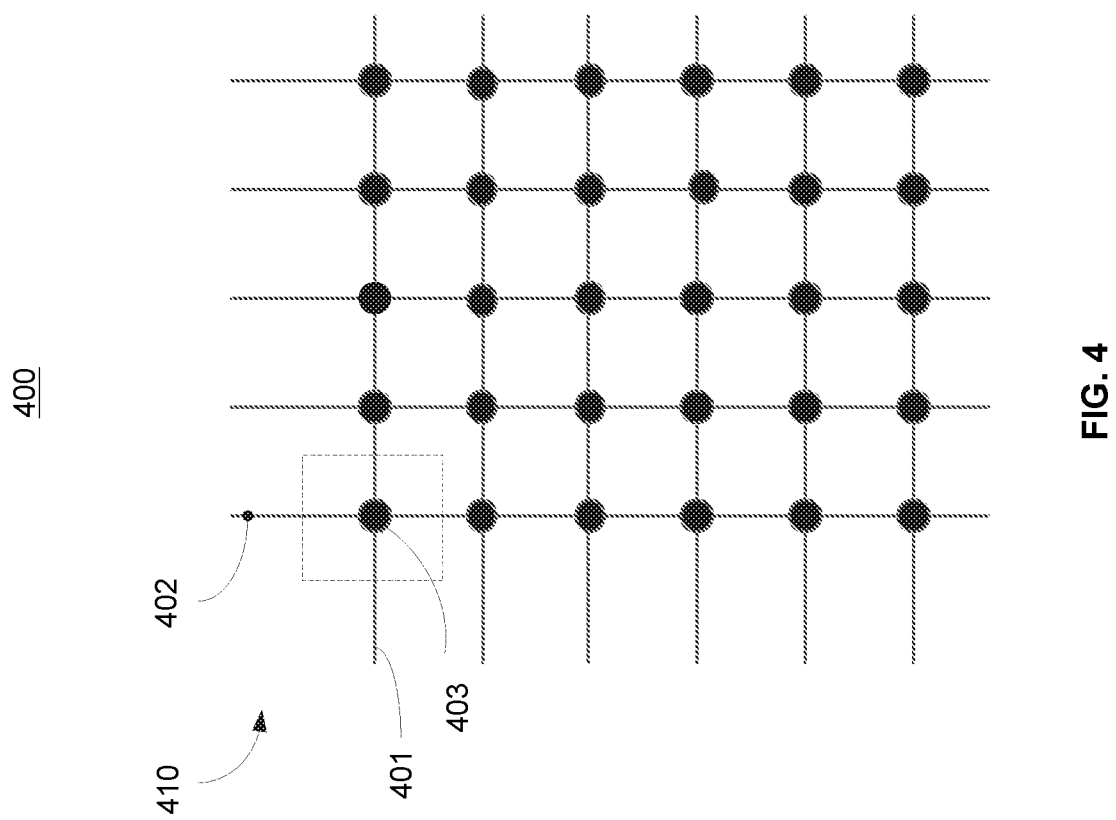
FIG. 4 is a block diagram illustrating an example crossbar array implemented with one or more non-filamentary RRAM devices in accordance with some implementations of the present disclosure.

FIG. 4 is a block diagram 400 illustrating an example crossbar array 410 implemented with one or more non-filamentary RRAMs in accordance with some implementations of the present disclosure. As shown in FIG. 400, the crossbar array 410 includes a first row wire 401, a first column wire 402, and a cross-point device 403 connecting between the first row wire 401 and the first column wire 402.

Figure 5:
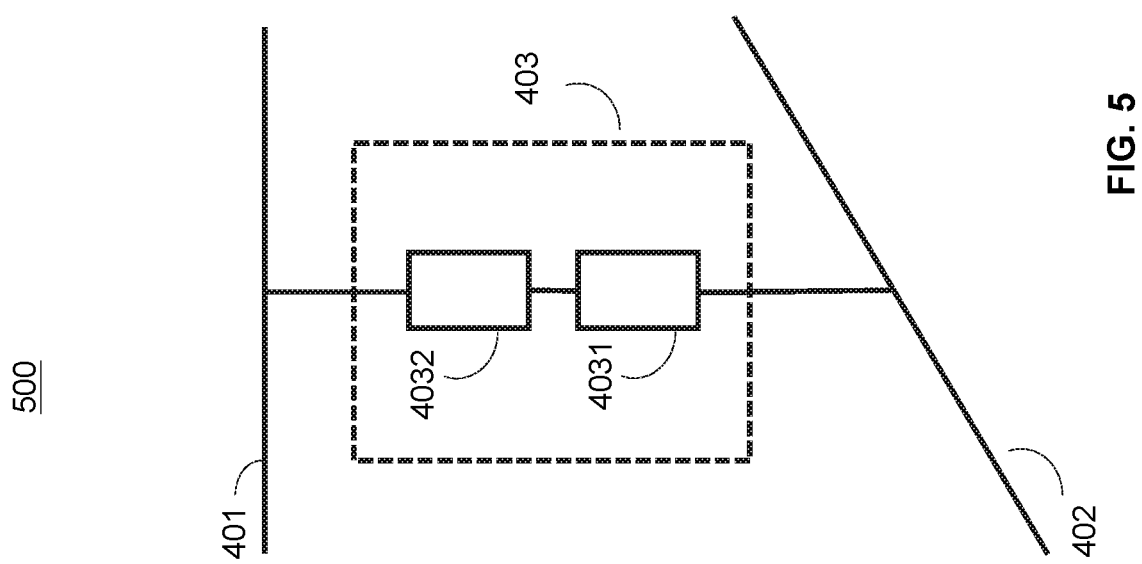
FIG. 5 is a block diagram illustrating an example non-filamentary RRAM device in accordance with some implementations of the present disclosure.

FIG. 5 is a block diagram 500 illustrating a partially enlarged view of the example cross-point device 403 shown in FIG. 4 in accordance with some implementations of the present disclosure.

As shown in FIG. 5, the cross-point device 403 includes a non-filamentary RRAM device 4031 and an access control device 4032 serially connecting to the non-filamentary RRAM 4031.

The cross-point device 403 is, in some implementations, capable of scaling down to no more than 40×40 nm$^2$. A set and/or reset current of the non-filamentary RRAM 4031 may be equal to or less than 10 μA.

The access control device 4032, in some implementations, includes a transistor or a selector. The cross-point device 403 may therefore be of a 1T1R or a 1S1R structure.

In some implementations, the non-filamentary RRAM 4031 can be selected from the following RRAMs: a VMCO, (vacancy modulated conductive oxide) TiN/TiO$_2$/a-Si/TiN, a TiN/Ta$_2$O$_5$/TaO$_x$/TiN RRAM, a Ta/TaO$_x$/TiO$_2$/Ti RRAM, and a TiN/TiO$_2$/Al$_2$O$_3$/TiN RRAM.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:
    a first row wire;
    a first column wire;
    a non-filamentary RRAM;
    an access control device, wherein
        the non-filamentary RRAM and the access control device are serially connected;
        the non-filamentary RRAM and the access control device connect the first row wire with the first column wire; and
        wherein the non-filamentary RRAM is selected from one of: a VMCO (vacancy modulated conductive oxide) TiN/TiO2/a-Si/TiN) RRAM, a TiN/Ta2O5/TaOx/TiN RRAM, a Ta/TaOx/TiO2/Ti RRAM, and a TiN/TiO2/Al2O3/TiN RRAM.

2. The apparatus as claimed in claim 1, wherein the non-filamentary RRAM and the access control device form a cross-point device.

3. The apparatus as claimed in claim 1, wherein the cross-point device is less than 40×40 nm$^2$.

4. The apparatus as claimed in claim 1, wherein a set current of the non-filamentary RRAM is no more than 10 μA.

5. The apparatus as claimed in claim 1, wherein a reset current of the non-filamentary RRAM is no more than 10 μA.

6. The apparatus as claimed in claim 1, wherein the access control device comprises a transistor or a selector.

* * * * *